United States Patent
Forejt et al.

(10) Patent No.: US 8,618,882 B2
(45) Date of Patent: Dec. 31, 2013

(54) VARIABLE GAIN AMPLIFIER

(71) Applicant: Texas Instruments Incorporated, Dallas, TX (US)

(72) Inventors: Brett Forejt, Garland, TX (US); Jeff Berwick, Sunnyvale, CA (US); David J. Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/730,502

(22) Filed: Dec. 28, 2012

(65) Prior Publication Data

US 2013/0113566 A1 May 9, 2013

Related U.S. Application Data

(62) Division of application No. 13/047,505, filed on Mar. 14, 2011, now Pat. No. 8,350,623.

(51) Int. Cl.
*H03F 3/45* (2006.01)

(52) U.S. Cl.
USPC .......................................................... 330/254

(58) Field of Classification Search
USPC .................................................. 330/252–261
See application file for complete search history.

(56) References Cited

U.S. PATENT DOCUMENTS

| | | | |
|---|---|---|---|
| 3,597,698 A * | 8/1971 | Matarese | 330/63 |
| 5,436,588 A | 7/1995 | Ghaffaripour | |
| 5,537,081 A | 7/1996 | Naokawa et al. | |
| 6,774,684 B2 | 8/2004 | Wu et al. | |
| 7,227,413 B1 | 6/2007 | Marty | |
| 8,154,337 B1 | 4/2012 | Hoomes et al. | |
| 8,155,349 B2 | 4/2012 | Yamamoto et al. | |

* cited by examiner

*Primary Examiner* — Hieu Nguyen
(74) *Attorney, Agent, or Firm* — Alan A. R. Cooper; W. James Brady, III; Frederick J. Telecky, Jr.

(57) ABSTRACT

An apparatus and method are provided. Generally, an input signal is applied across a main path (through an input network) and across a cancellation path (through a cancellation circuit). The cancellation circuit subtracts a cancellation current from the main path as part of the control mechanism, where the magnitude of the cancellation current is based on a gain control signal (that has been linearized to follow a control voltage).

19 Claims, 8 Drawing Sheets

| FIG. 4A | FIG. 4B | FIG. 4C |
|---|---|---|
| FIG. 4D | FIG. 4E | FIG. 4F |

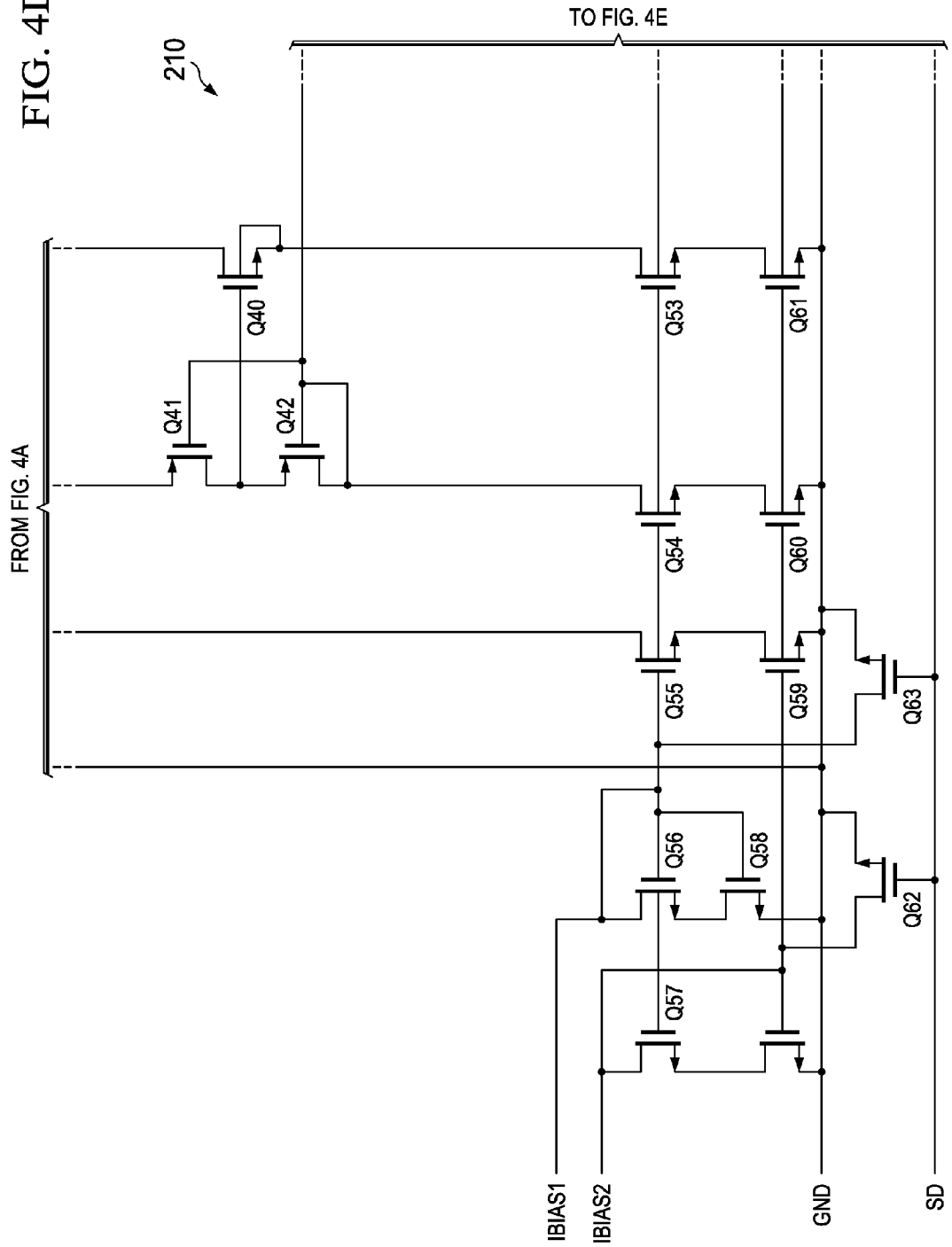

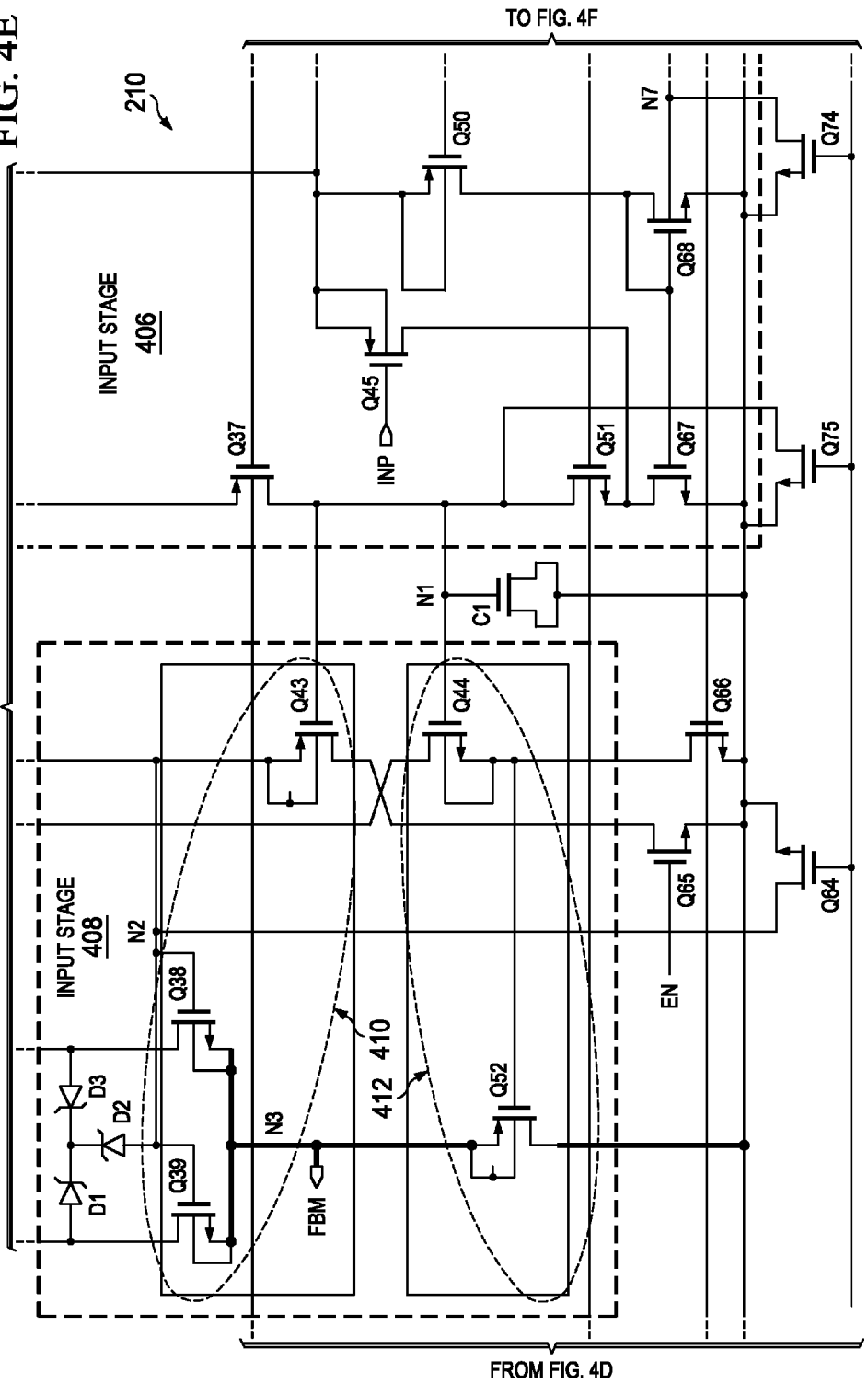

VARIABLE GAIN AMPLIFIER

CROSS-REFERENCE TO RELATED APPLICATIONS

This application is a divisional of U.S. patent application Ser. No. 13/047,505 (U.S. Pat. No. 8,350,623 entitled "VARIABLE GAIN AMPLIFIER," filed on Mar. 14, 2011, which is incorporated by reference herein for all purposes.

TECHNICAL FIELD

The invention relates generally to variable gain amplifier and, more particularly, to a CMOS continuously variable gain amplifier.

BACKGROUND

Typically, variable gain amplifiers fall into one of two categories: multiplier based or digitally controlled. The multiplier based amplifiers are usually based on Gilbert cells and can provide continuous variability in terms of gain. Digitally controlled amplifiers, on the other hand, provide discrete gains, which may not be suitable for many applications. With conventional continuously variable amplifiers, such as Gilbert cell type amplifiers, step transitions (such as "on" and "off") can generate distortion, such as a "pop" or "click" with audio applications. Additionally, Gilbert cell multipliers would generally require high performance bipolar transistors, which are not generally available in CMOS processes.

Turning to FIG. 1, an example of conventional continuously variable amplifier 100 can be seen. Amplifier 106 generally comprises a transconductance circuit 104, a feedback network (i.e., resistors R5 ad R6), and a shunt circuit 106. The shunt circuit 106 generally comprises resistors R1 through R4, and shunt switches Q1 and Q2 (which can be NMOS transistors as shown). In operation, the gain control signal GC is applied to the shunt switches Q1 and Q2. As the gain control signal GC is ramped or increased from 0V, the shunt switches Q1 and Q2 begin shorting the differential input signal applied to the shunt circuit 106 by the input source 102 so as to mute or "shut off" the input signal. Because this shunt circuit 106 is in the main signal path (from the input source 102 to the transconductance circuit 104), the shunt circuit 106 can introduce distortion. Point in fact, as the gain control signal GC increases, the total harmonic distortion (THD) increases, meaning that the THD performance of amplifier 100 limits the gain range of amplifier 100. Therefore, there is a need for an improved amplifier.

Some other conventional circuits are: U.S. Pat. Nos. 5,436,588; 5,537,081; 6,774,684; and 7,227,413.

SUMMARY

A preferred embodiment of the present invention, accordingly, provides an apparatus. The apparatus comprises a transconductance circuit having a positive input terminal and a negative input terminal; an input network that is coupled to the positive and negative input terminals of the transconductance circuit and that receives an input signal; a control circuit that generates a gain control signal; and a cancellation circuit that is coupled to the positive and negative input terminals of the transconductance circuit, that is coupled to the gain control circuit, and that receives the input signal, wherein the cancellation circuit subtracts a cancellation current from the positive and negative input terminals of the transconductance circuit, and wherein the magnitude of the cancellation current is based at least in part on the gain control signal.

In accordance with a preferred embodiment of the present invention, the cancellation circuit further comprises: a first impedance network that receives a positive portion of the input signal that is coupled to the negative input terminal of the transconductance circuit; a second impedance network that receives a negative portion of the input signal and that is coupled to the positive input terminal of the transconductance circuit; and a plurality of shunt switches that are coupled between the first impedance network and the second impedance network, wherein each shunt switch is coupled to the control circuit so as to receive the gain control signal.

In accordance with a preferred embodiment of the present invention, the control circuit receives a control voltage and linearizes the gain control signal such that the gain control signal follows the control voltage.

In accordance with a preferred embodiment of the present invention, the control circuit further comprises: an amplifier having a positive input terminal, a negative input terminal, and an output terminal, wherein the negative input terminal of the amplifier receives the control voltage; an NMOS transistor that is coupled to the output terminal of the amplifier at its gate and the positive input terminal of the amplifier at its drain.

In accordance with a preferred embodiment of the present invention, the control circuit further comprises: a current source that is coupled to the drain of the NMOS transistor; and a resistor that is coupled between the drain and source of the NMOS transistor.

In accordance with a preferred embodiment of the present invention, the resistor further comprises a first resistor, and wherein the input network further comprises: a second resistor that receives the positive portion of the input signal and that is coupled to the positive input terminal of the transconductance circuit; and a third resistor that receives the negative portion of the input signal and that is coupled to the negative input terminal of the transconductance circuit.

In accordance with a preferred embodiment of the present invention, the first impedance network further comprises a plurality of fourth resistors coupled in series with one another, and wherein the second impedance network further comprises a plurality of fifth resistor coupled in series with one another, and wherein NMOS transistor further comprises a first NMOS transistor, and wherein the plurality of shunt switches further comprises: a second NMOS transistor that is coupled to the first impedance network at its drain and the output terminal of the amplifier at its gate; and a third NMOS transistor that is coupled to the second impedance network at its drain, the output terminal of the amplifier at its gate, and the source of the second NMOS transistor at its source.

In accordance with a preferred embodiment of the present invention, the amplifier further comprises a first amplifier, and wherein the transconductance circuit further comprises a positive output terminal and a negative output terminal, and wherein the apparatus further comprises: a second amplifier that is coupled to the positive output terminal of the transconductance circuit; and a third amplifier that is coupled to the negative output terminal of the transconductance circuit.

In accordance with a preferred embodiment of the present invention, a method is provided. The method comprises increasing a control voltage; generating a gain control signal that follows the control voltage; and subtracting a cancellation current from an input of a transconductance circuit, wherein the magnitude of the cancellation current is proportional to the gain control signal.

In accordance with a preferred embodiment of the present invention, the method further comprises amplifying the input signal that is applied to the input of the transconductance circuit through an input network.

In accordance with a preferred embodiment of the present invention, the input of the transconductance circuit further comprises a positive input terminal and a negative input terminal, and wherein the step of subtracting further comprises: applying a positive portion of the input signal to the negative input terminal of the transconductance circuit through a first impedance network; applying a negative portion of the input signal to the positive input terminal of the transconductance circuit through a second impedance network; and controlling a plurality of shunt switches coupled between the first and second impedance networks with the gain control signal.

In accordance with a preferred embodiment of the present invention, the step of generating the gain control signal further comprises setting the impedance of a control switch with a feedback loop such that gain control signal follows the control signal.

In accordance with a preferred embodiment of the present invention, an apparatus is provided. The apparatus comprises a positive input terminal for the apparatus; a negative input terminal for the apparatus, wherein the positive and negative input terminals for the apparatus receive positive and negative portions of an input signal, respectively; a first resistor that is coupled to the positive input terminal for the apparatus; a second resistor that is coupled to the negative input terminal for the apparatus; a cancellation circuit having: a third resistor that is coupled to the positive input terminal for the apparatus; a fourth resistor that is coupled to the negative input terminal for the apparatus; a plurality of shunt switches that are coupled between the third resistor and the forth resistor; a fifth resistor that is coupled to the third resistor; and a sixth resistor that is coupled to the fourth resistor; a control circuit that generates a gain control signal that follows a control voltage and that is coupled to provide the gain control signal to each of the shunt switches; and a transconductance circuit having a positive input terminal and a negative input terminal, wherein the negative input terminal of the transconductance circuit is coupled to the second and sixth resistors, and wherein the positive input terminal of the transconductance circuit is coupled to the third and fifth resistors.

In accordance with a preferred embodiment of the present invention, the plurality of shunt switches further comprises: a first NMOS transistor that is coupled to the third resistor at its drain and the control circuit at its gate; and a second NMOS transistor is coupled to the fourth transistor at its drain, the control circuit at its gate, and the source of the first NMOS transistor at its source.

In accordance with a preferred embodiment of the present invention, the control circuit further comprises: an amplifier having a positive input terminal, a negative input terminal, and an output terminal, wherein the negative input terminal of the amplifier receives the control voltage, and wherein the output terminal of the amplifier is coupled to the gates of the first and second NMOS transistors; a third NMOS transistor that is coupled to the output terminal of the amplifier at its gate and the positive input terminal of the amplifier at its drain; a seventh resistor that is coupled between the drain and source of the third NMOS transistor; and a current source that is coupled to the drain of the third NMOS transistor.

In accordance with a preferred embodiment of the present invention, the transconductance circuit further comprises a positive output terminal and a negative output terminal, and wherein the apparatus further comprises: an eight resistor that is coupled between the positive input and output terminals of the transconductance circuit; and an ninth resistor that is coupled between the negative input and output terminals of the transconductance circuit.

In accordance with a preferred embodiment of the present invention, the first, second, third, fourth, fifth, sixth, seventh, eighth, and ninth resistors are each about 100 kΩ, 100 kΩ, 90 kΩ, 90 kΩ, 10 kΩ, 10 kΩ, 10 kΩ, 100 kΩ and 100 kΩ, respectively.

In accordance with a preferred embodiment of the present invention, the transconductance circuit further comprises a positive output terminal and a negative output terminal, and wherein the amplifier further comprises a first amplifier, and wherein the apparatus further comprises: a second amplifier having a positive input terminal, a negative input terminal, and a positive output terminal, and a negative output terminal, wherein the negative input terminal of the second amplifier is coupled to the positive output terminal of the transconductance circuit; a third amplifier having a positive input terminal, a negative input terminal, and a positive output terminal, and a negative output terminal, wherein the negative input terminal of the third amplifier is coupled to the negative output terminal of the transconductance circuit, and wherein the positive input terminals of the second and third amplifiers receive a reference voltage; an eight resistor that is coupled between the positive input and output terminals of the second amplifier; and an ninth resistor that is coupled between the negative input and output terminals of the third amplifier.

In accordance with a preferred embodiment of the present invention, the first, second, third, fourth, fifth, sixth, seventh, eighth, and ninth resistors are each about 100 kΩ, 100 kΩ, 90 kΩ, 90 kΩ, 10 kΩ, 10 kΩ, 10 kΩ, 2 MΩ, and 2 MΩ, respectively.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
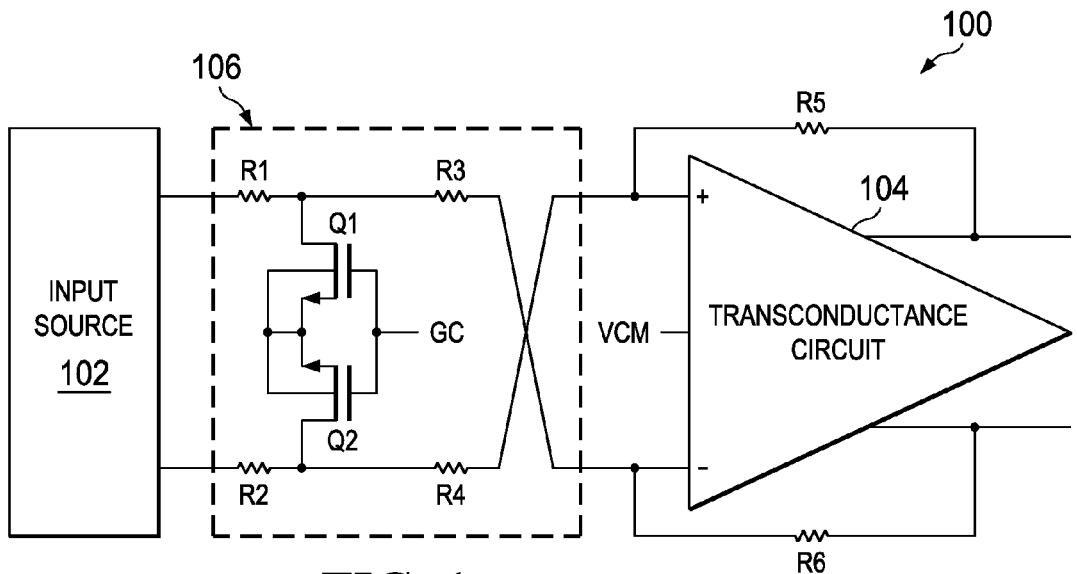
FIG. 1 is an example of a conventional continuously variable amplifier.

Refer now to the drawings wherein depicted elements are, for the sake of clarity, not necessarily shown to scale and wherein like or similar elements are designated by the same reference numeral through the several views.

Figures 2, 4:
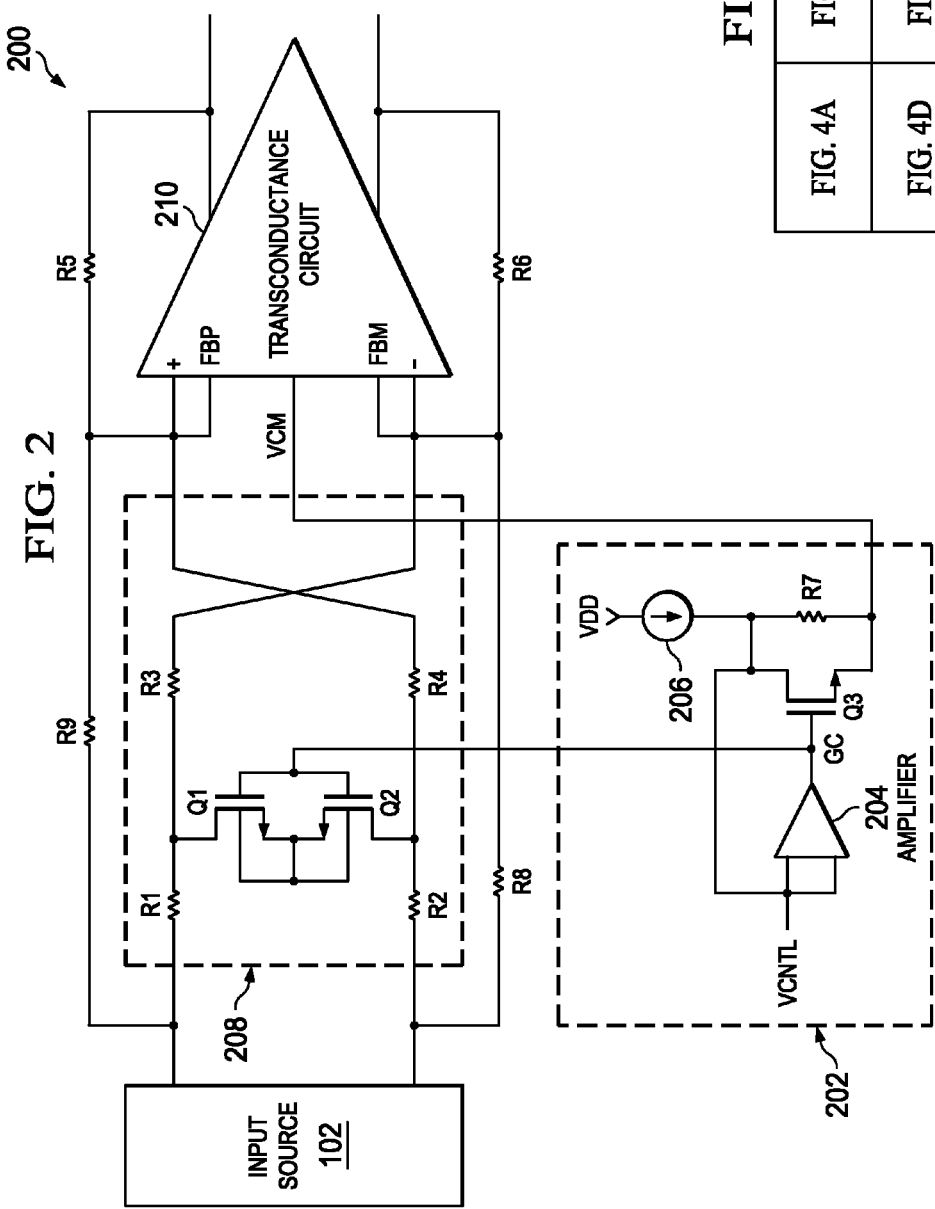
FIG. 4 is an example of a transconductance circuit of FIGS. 2 and 3.
Figure 4A:
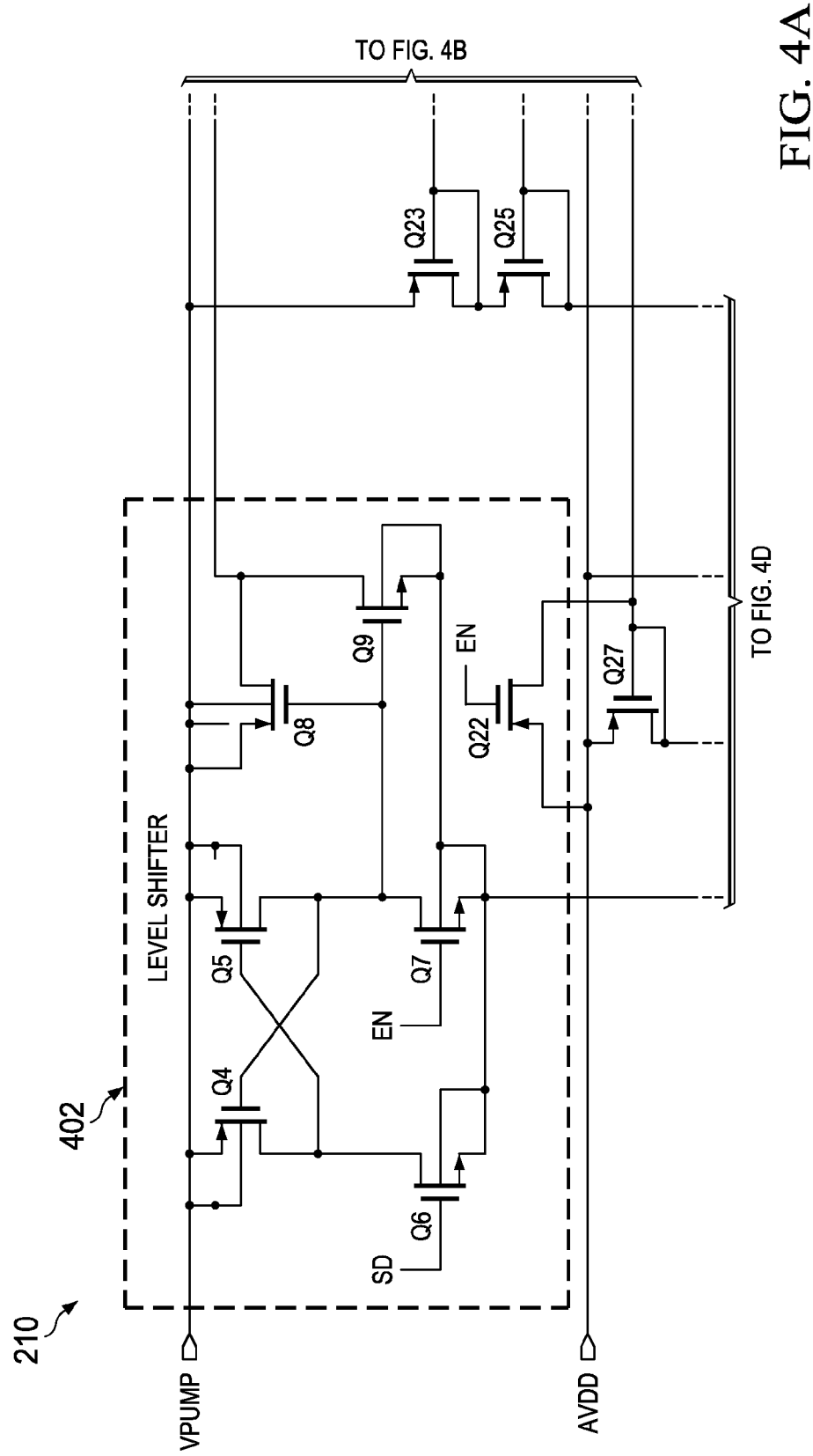
Figure 4B:
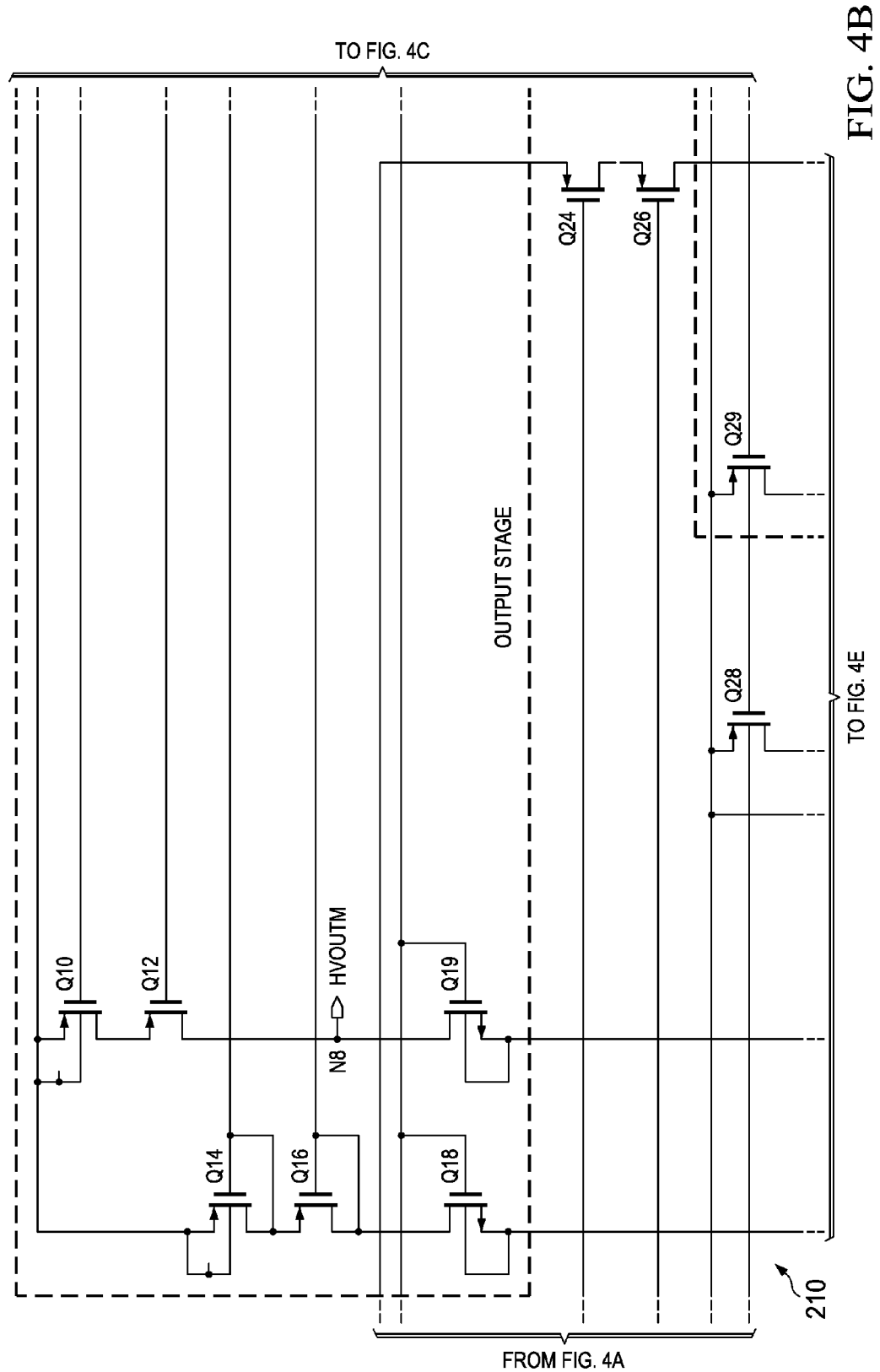
Figure 4C:
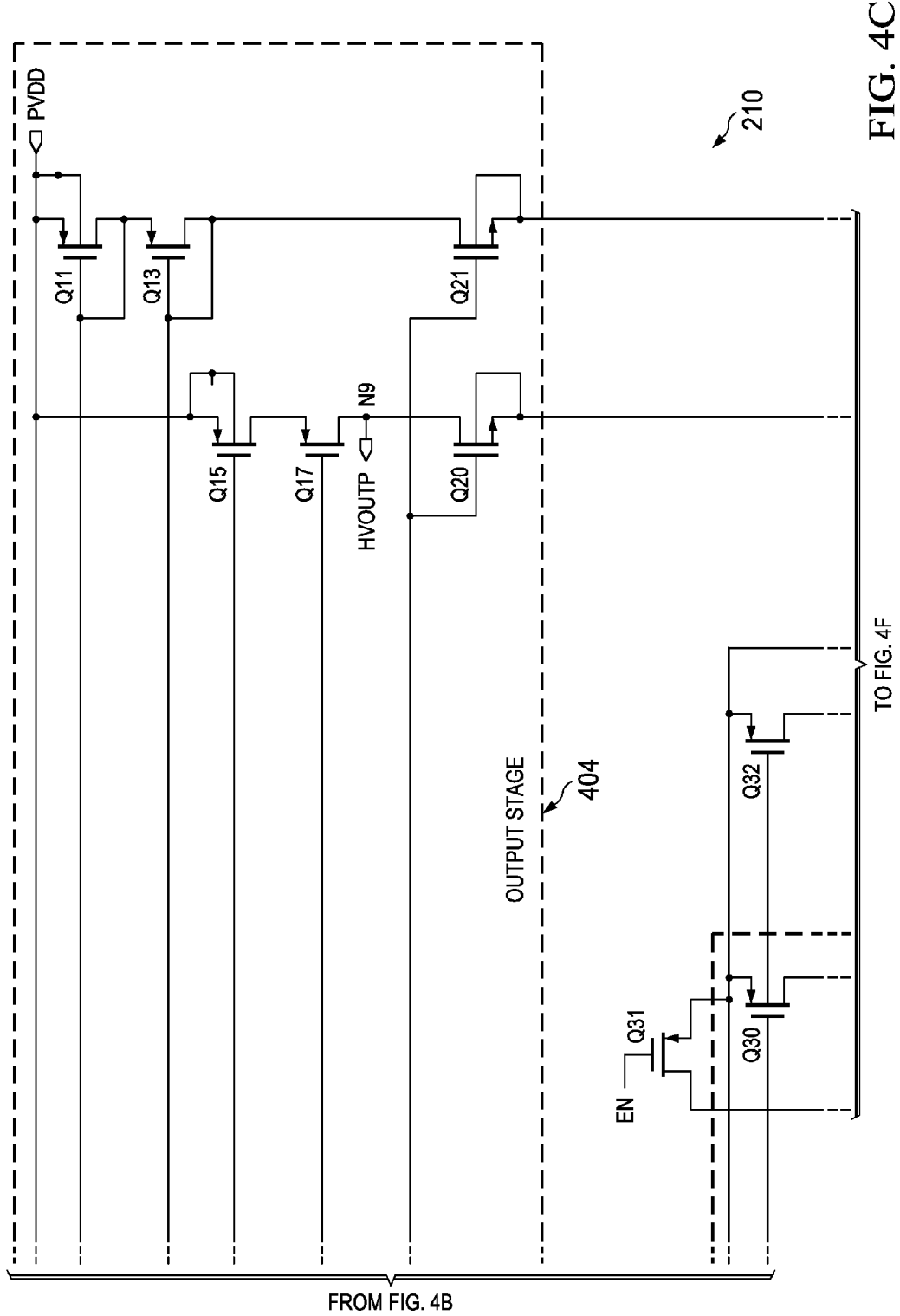
Figure 4F:
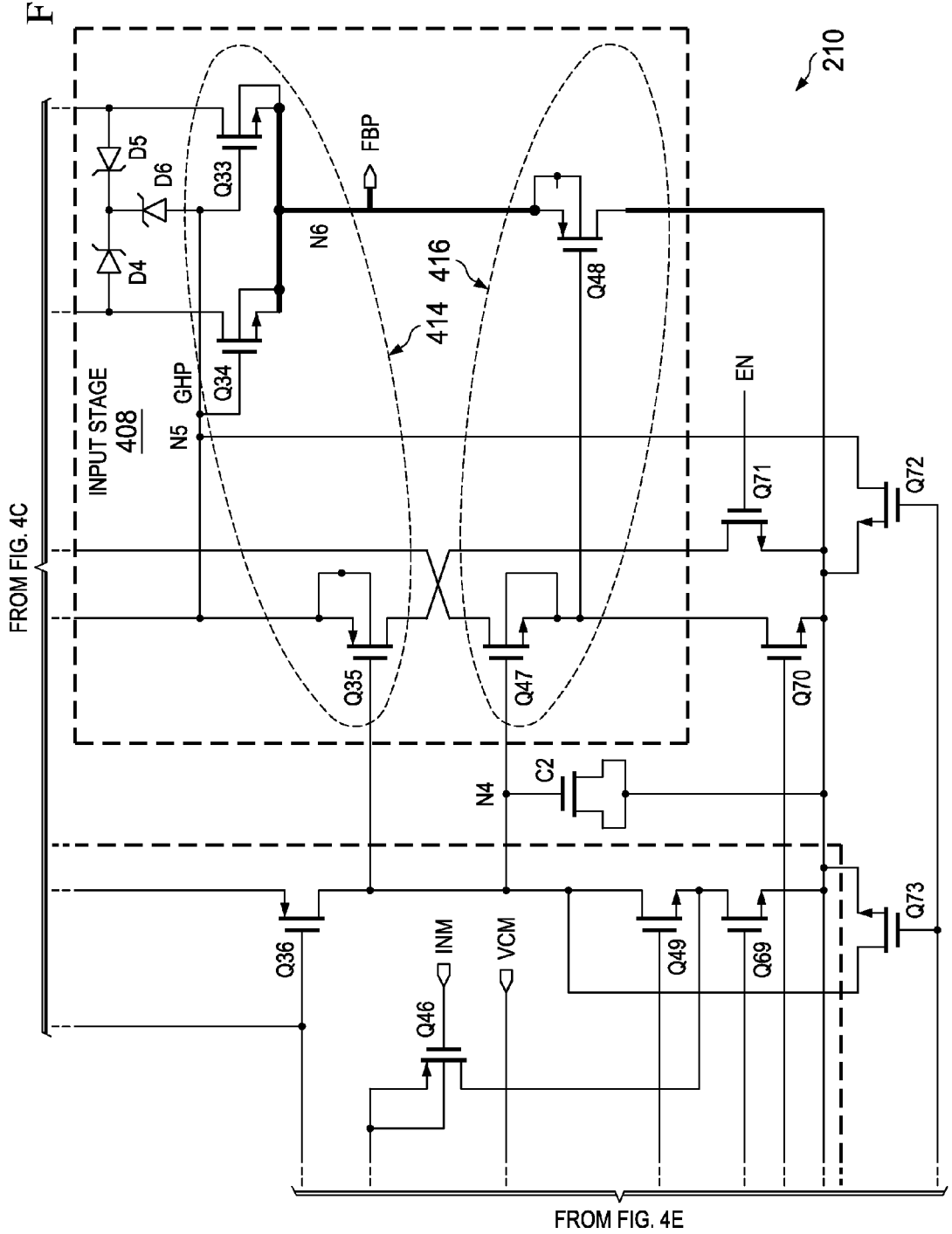

Turning to FIG. 2, an example of a continuously variable amplifier 200 can be seen. Amplifier 200 is similar in structure to amplifier 100, but the shunt circuit 106 has been replaced with cancellation circuit 208, control circuit 202, and an input network. The control circuit 202 generally comprises amplifier 204, a control switch Q3 (which can be an NMOS transistor), resistor R7 (which can have a resistance of about 10 kΩ and which is coupled to receive the common mode voltage VCM), and current source 206 (which is generally coupled to supply rail VDD). The input network generally comprises resistors R8 and R9 (which can each have a resistance of about 100 kΩ), and the cancellation circuit 208 generally comprises resistors R1, R2, R3, and R4 (which can have resistance of about 90 kΩ, 90 kΩ, 10 kΩ, and 10 kΩ, respectively), and shunt switches Q1 and Q2 (which can be NMOS transistors). Additionally, resistors R5 and R6 of the feedback network can each have a resistance of about 100 kΩ.

A reason for including the control circuit 202 is to linearize the gain control signal GC. As shown, a control voltage VCNTL is applied to the negative input terminal of amplifier 204. The amplifier 204, resistor R7, and current source 206, collectively, operate as a feedback or control loop for switch Q3. This control loop sets the impedance for switch Q3 so that the voltage applied to the gate of switch Q3 (which is the gain control signal GC) follows the control voltage VCNTL, effectively linearizing the gain control signal GC.

While the structure of the cancellation circuit 208 may appear to be similar to the shunting circuit 106, there are some important differences. First, for amplifier 200, there are two separate signal paths from the input source 102 to the transconductance circuit 104, namely a main signal path through the input network and a cancellation path through the cancellation circuit 208. Second, the impedance network (i.e., resistors R1/R2) that carries the positive portion of the input signal is coupled to the negative input terminal of the transconductance circuit 104, while the impedance network (i.e., resistors R2/R4) that carries the negative portion of the input signal is coupled to the positive input terminal of the transconductance circuit 104. This arrangement allows the cancellation circuit 308 to remove or subtract a cancellation current from the input terminals of the transconductance circuit 104 (instead of directly clamping), and this arrangement allows the distortion (introduced by cancellation circuit 208) to increase inversely with the control voltage VCNTL or gain control signal GC. Thus, the THD decreases proportionally with an increasing gain control signal, allowing for a wider gain range than amplifier 100 (i.e., a nearly 20 dB increase).

Figure 3:
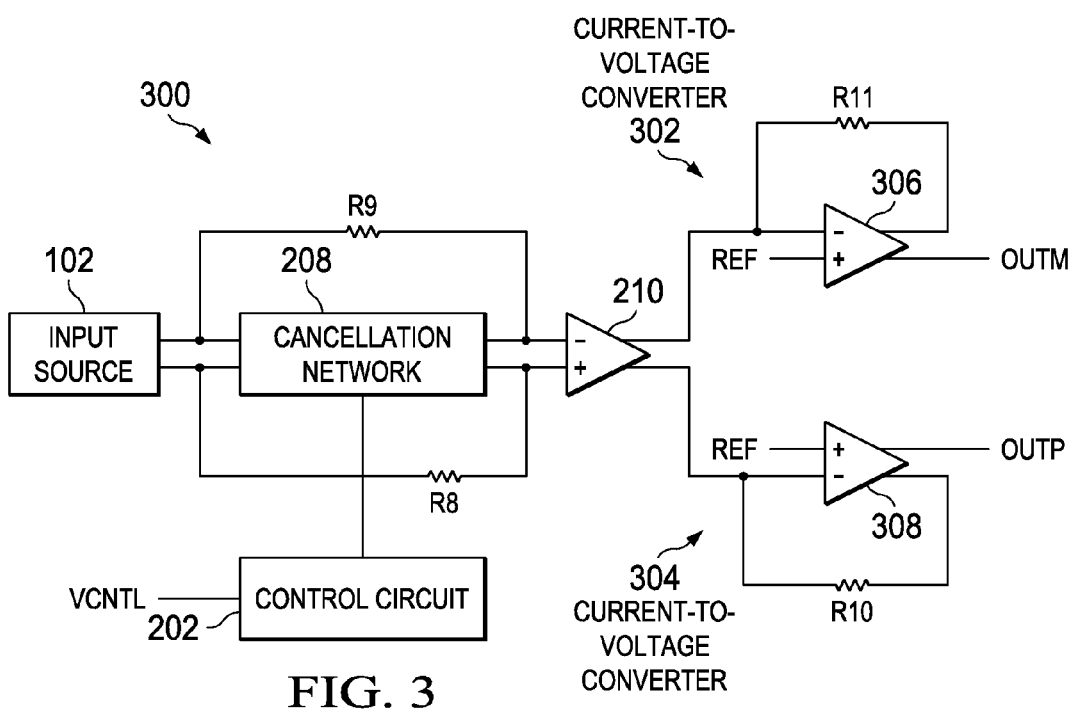
FIGS. 2 and 3 are examples of continuously variable amplifier in accordance with a preferred embodiment of the present invention.

Turning to FIG. 3, another example of a variable gain amplifier 300 can be seen. Amplifier 300 is similar to amplifier 200, but amplifier 300 also includes current-to-voltage converter 302 and 304. Each of these voltage-to-current converters 302 and 304 includes an amplifier 306 and 308, respectively, and a resistor R11 and R10, respectively, (which can each have a resistance of about 2 MΩ. These current-to-voltage converters 302 and 304 generate output voltages OUTP and OUTM from the currents generated by the transconductance circuit 210.

Turning to FIG. 4, the transconductance circuit 210 can be seen in greater detail. One feature of this transconductance circuit 210 is that it operates using different voltage domains (i.e., AVDD and PVDD). The supply voltage AVDD is typically a low voltage supply (i.e., 3.6V), while supply voltage PVDD is a high voltage supply (i.e., 200V). Generally, this arrangement can be used to drive motors or piezeoelectric transducers (i.e., for haptics applications). The transconductance circuit 210 generally comprises a level shifter 402, input stages 406 and 408, and output stage 404. The transconductance circuit 210 also includes current bias network (having transistors Q53 to Q61 that receive bias currents IBIAS1 and IBIAS2) and transistors Q40 through Q42 (that can be included for reliability). Additionally, the level shifter 402 (which includes transistors Q4 through Q9) is generally a digital signal level shifter that generates a logic high signal at pump voltage VPUMP (which can be about 7.5V and that can be created by capacitive boost from supply voltage AVDD).

When the transconductance circuit 210 is "shut down" or off, the shut down signal SD is asserted or logic high, while enable signal EN is logic low. In this state, transistors Q7, Q22, Q31, Q65, and Q71 are deactivated, while transistors Q6, Q62 to Q64 and Q72 to Q75 are activated. With Q6, Q62 to Q64 and Q72 to Q75 being activated, the level shifter 402 and current bias network are "off," and nodes N1 through N7 are pulled to ground, which shuts off or inactivates input stages 406 and 408.

When operational, the enable signal EN is logic high (while the shut down signal SD is logic low) so as to activate Q7, Q22, Q31, Q65, and Q71 and to deactivate transistors Q6, Q62 to Q64 and Q72 to Q75. In this operational state, the pump voltage VPUMP can then be provided via level shifter 402 to activate transistors Q18 to Q21, which also activates the high voltage current mirrors (i.e., high voltage, isolated PMOS transistors Q10 through Q17) of the output stage 404. The pump voltage VPUMP can also be applied to the current mirrors formed by transistors Q23 to Q26 so as to operate as a current source for the differential input pair Q45 and Q46 of input stage 406. Additionally, because transistors Q22 and Q31 are activated, diode-connected transistor Q27 is bypassed so as to apply supply voltage AVDD as the bias voltage for transistors Q28, Q29, Q30, and Q32, while the supply voltage AVDD is applied to the gates of transistors Q36 and Q37.

In operation, the outputs from input stage 406 (i.e., nodes N1 and N2) are used to drive input stage 408. As shown, the differential input signals INP and INM are applied to the gates of transistors Q45 and Q46 (differential input pair), which operates (in conjunction with transistors Q49, Q51, Q67, and Q69) as a folded cascode amplifier. Additionally, the input stage 406 includes a common mode feedback circuit (which generally comprises transistors Q50 and Q68). Transistors Q50 receives a common mode voltage VCM at its gate and generates a steering current for transistor Q68 (which is diode-connected and which forms a current mirror with transistors Q67 and Q69). The arrangement of the common mode circuit (as shown) is simpler than other conventional common mode feedback arrangements, which can, at least in part, be attributed to the inputs and outputs of input stage 406 being shorted so as to allow for a "built in" averaging. Additionally, the outputs from input stage 406 (i.e., nodes N1 and N2) are capacitively coupled to ground (i.e., through capacitors C1 and C2)

The outputs from the input stage 406 can then be used by input stage 408 to generate differential output signals HVOUTP and HVOUTM in the output stage 404. Input stage 408 is generally comprised of a two portions (positive and negative) that include darlington pairs 410, 412, 414, and 416. As shown, each portion includes four source-followers (i.e., transistors Q38/Q39, Q43, Q44, and Q52 for pairs 410 and 412 and transistors Q33/Q34, Q35, Q47, and Q49 for the pairs 414 and 416). These source-followers are arranged such that the voltage on nodes N1 and N4 should be approximately equal to the feedback voltages FBM and FBP, respectively. Additionally, darlington pairs 410 and 414 are arranged as modified folded darlington pairs, where the source-followers (which are formed by transistors Q38/Q39 and Q33/Q34 and coupled to the output stage 404) are split to form two legs that are folded around current summing nodes N3 and N6. This arrangement (in conjunction with Zener diodes D1 through D6) allows the currents at nodes N3 and N6 to be summed in the correct phases to obtain an AB current (i.e., for signals HVOUTM and HVOUTP) at nodes N8 and N9. Thus, transconductance circuit 210 converts the input voltage (from signals INP and INM) to an output current (in signals HVOUTM and HVOUTP).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a transconductance circuit having a positive input terminal and a negative input terminal, the transconductance circuit including:
   a level shifter;
   an output stage coupled to the level shifter;
   a first input stage coupled to the output stage
   a second input stage coupled to the output stage,
   the first and second input stage each comprising a first and second darlington pair,
   wherein the level shifter is a digital signal level shifter that generates a logic high signal at pump a voltage.

2. The apparatus of claim 1, wherein transconductance circuit operates using a plurality of voltage domains.

3. The apparatus of claim 1, wherein the transconductance circuit is used to drive motors or piezoelectric transducers.

4. The apparatus of claim 1, wherein the transconductance amplifier further includes a current bias network coupled to the first and second input stages.

5. The apparatus of claim 1, wherein a differential input pair of the transconductance circuit operates in conjunction with a plurality of transistors as a folded cascode amplifier.

6. The apparatus of claim 1, wherein the first input stage includes a common mode feedback circuit wherein the inputs and outputs of input stage being shorted.

7. The apparatus of claim 1, wherein the first darlington pairs of the first and second input circuits are arranged as folded darlington pairs.

8. The apparatus of claim 1, further including:
   an input network that is coupled to the positive and negative input terminals of the transconductance circuit and that receives an input signal;
   a control circuit that generates a gain control signal; and
   a cancellation circuit that is coupled to the positive and negative input terminals of the transconductance circuit, that is coupled to the gain control circuit, and that receives the input signal, wherein the cancellation circuit subtracts a cancellation current from the positive and negative input terminals of the transconductance circuit, and wherein the magnitude of the cancellation current is based at least in part on the gain control signal.

9. The apparatus of claim 1, wherein the cancellation circuit further comprises:
   a first impedance network that receives a positive portion of the input signal that is coupled to the negative input terminal of the transconductance circuit;
   a second impedance network that receives a negative portion of the input signal and that is coupled to the positive input terminal of the transconductance circuit; and
   a plurality of shunt switches that are coupled between the first impedance network and the second impedance network, wherein each shunt switch is coupled to the control circuit so as to receive the gain control signal.

10. The apparatus of claim 9, wherein the control circuit receives a control voltage and linearizes the gain control signal such that the gain control signal follows the control voltage.

11. The apparatus of claim 10, wherein the control circuit further comprises:
   an amplifier having a positive input terminal, a negative input terminal, and an output terminal, wherein the negative input terminal of the amplifier receives the control voltage; and
   an NMOS transistor that is coupled to the output terminal of the amplifier at its gate and the positive input terminal of the amplifier at its drain.

12. An apparatus comprising:
    a positive input terminal for the apparatus;
    a negative input terminal for the apparatus, wherein the positive and negative input terminals for the apparatus receive positive and negative portions of an input signal, respectively;
    a first resistor that is coupled to the positive input terminal for the apparatus;
    a second resistor that is coupled to the negative input terminal for the apparatus;
    a cancellation circuit having:
       a third resistor that is coupled to the positive input terminal for the apparatus;
       a fourth resistor that is coupled to the negative input terminal for the apparatus;
       a plurality of shunt switches that are coupled between the third resistor and the forth resistor;
       a fifth resistor that is coupled to the third resistor; and
       a sixth resistor that is coupled to the fourth resistor;
    a control circuit that generates a gain control signal that follows a control voltage and that is coupled to provide the gain control signal to each of the shunt switches; and
    a transconductance circuit having a positive input terminal and a negative input terminal, wherein the negative input terminal of the transconductance circuit is coupled to the second and sixth resistors, and wherein the positive input terminal of the transconductance circuit is coupled to the third and fifth resistors,
    the transconductance circuit including:
       a level shifter;
       an output stage coupled to the level shifter;
       a first input stage coupled to the output stage
       a second input stage coupled to the output stage,
       the first and second input stage each comprising a first and second darlington pair.

13. The apparatus of claim 12, wherein the transconductance circuit is used to drive motors or piezoelectric transducers.

14. The apparatus of claim 12, wherein the first input stage includes a common mode feedback circuit wherein the inputs and outputs of input stage being shorted.

15. The apparatus of claim 12, wherein the first darlington pairs of the first and 414 are arranged as folded darlington pairs.

16. The apparatus of claim 12, wherein the plurality of shunt switches further comprises:

a first NMOS transistor that is coupled to the third resistor at its drain and the control circuit at its gate; and
a second NMOS transistor is coupled to the fourth transistor at its drain, the control circuit at its gate, and the source of the first NMOS transistor at its source.

17. The apparatus of claim 16, wherein the control circuit further comprises:
an amplifier having a positive input terminal, a negative input terminal, and an output terminal, wherein the negative input terminal of the amplifier receives the control voltage, and wherein the output terminal of the amplifier is coupled to the gates of the first and second NMOS transistors;
a third NMOS transistor that is coupled to the output terminal of the amplifier at its gate and the positive input terminal of the amplifier at its drain;
a seventh resistor that is coupled between the drain and source of the third NMOS transistor; and
a current source that is coupled to the drain of the third NMOS transistor.

18. A transconductance circuit having a positive input terminal and a negative input terminal, the transconductance circuit including:
a level shifter;
an output stage coupled to the level shifter;
a first input stage coupled to the output stage
a second input stage coupled to the output stage,
the first and second input stage each comprising a first and second darlington pair,
wherein the transconductance amplifier further includes a current bias network coupled to the first and second input stages, and
wherein a differential input pair of the transconductance circuit operates in conjunction with a plurality of transistors as a folded cascode amplifier,
wherein the transconductance circuit is further coupled to:
an input network that is coupled to the positive and negative input terminals of the transconductance circuit and that receives an input signal;
a control circuit that generates a gain control signal; and
a cancellation circuit that is coupled to the positive and negative input terminals of the transconductance circuit, that is coupled to the gain control circuit, and that receives the input signal, wherein the cancellation circuit subtracts a cancellation current from the positive and negative input terminals of the transconductance circuit, and wherein the magnitude of the cancellation current is based at least in part on the gain control signal.

19. The apparatus of claim 18, wherein the cancellation circuit further comprises:
a first impedance network that receives a positive portion of the input signal that is coupled to the negative input terminal of the transconductance circuit;
a second impedance network that receives a negative portion of the input signal and that is coupled to the positive input terminal of the transconductance circuit; and
a plurality of shunt switches that are coupled between the first impedance network and the second impedance network, wherein each shunt switch is coupled to the control circuit so as to receive the gain control signal.

* * * * *